United States Patent [19]

Duly et al.

[11] Patent Number: 4,523,974
[45] Date of Patent: Jun. 18, 1985

[54] METHOD OF FABRICATING A PELLICLE COVER FOR PROJECTION PRINTING SYSTEM

[75] Inventors: Dawn L. Duly; Henry Windischmann, both of Huntington; W. D. Buckley, Easton, all of Conn.

[73] Assignee: The Perkin-Elmer Corporation, Norwalk, Conn.

[21] Appl. No.: 592,040

[22] Filed: Mar. 21, 1984

Related U.S. Application Data

[62] Division of Ser. No. 466,268, Feb. 14, 1983, Pat. No. 4,465,759.

[51] Int. Cl.³ ............... C23F 1/00; B44C 1/22; C03C 15/00; C03C 25/06
[52] U.S. Cl. .................. 156/630; 156/632; 156/634; 156/645; 156/656; 156/652; 156/659.1; 156/247
[58] Field of Search ............ 430/5, 321; 156/632, 156/634, 645, 656, 659.1, 652, 247, 248, 250, 268, 629, 630, 631; 250/492.1, 492.2, 505.1

[56] References Cited

U.S. PATENT DOCUMENTS

| | | |
|---|---|---|
| 4,058,432 | 11/1977 | Schuster-Woldan ............ 156/659.1 |
| 4,170,512 | 10/1979 | Flanders et al. ............... 156/631 |
| 4,384,919 | 5/1983 | Casey ............................ 156/645 |

*Primary Examiner*—William A. Powell
*Attorney, Agent, or Firm*—Thomas P. Murphy; Edwin T. Grimes; F. L. Masselle

[57] ABSTRACT

The invention is also directed to a method of fabricating a pellicle cover assembly for use in a projection printing system for forming an image on a radiation sensitive wafer, the method comprising the steps of applying a gold film onto the surface of a wafer, applying a polymer film onto the gold film surface, curing the polymer film, adhering a support ring to the polymer film, cutting through the polymer and gold films between the ring and wafer edges to expose the wafer surface, peeling the ring off the wafer and etching off the gold film.

15 Claims, 9 Drawing Figures

METHOD OF FABRICATING A PELLICLE COVER FOR PROJECTION PRINTING SYSTEM

This application is a division of application Ser. No. 466,268, filed 2/14/83, now U.S. Pat. No. 4,465,759.

FIELD OF INVENTION

This invention relates to projection printing systems and, more particularly, to such a system having a pellicle covering the mask and/or wafer. The systems according to the invention are particularly adapted, among other possible uses, for effecting the exposure of photoresist-coated semiconductor wafers in the manufacture of integrated circuits.

This application is closely related to U.S. patent application entitled "Pellicle Cover for Photomask", filed on even data herewith, and bearing Ser. No. 466,264 (now abandoned), and U.S. patent application entitled "A Method of Fabricating a Pellicle Cover for Photomask", filed on even date herewith, and bearing Ser. No. 466,269 (now abandoned).

BACKGROUND OF THE INVENTION

Projection printing systems for forming an image on a light sensitive substrate or wafer normally include a mask having a transparent substrate with a pattern or opaque and transparent areas formed on one surface thereof, an illumination system for directing a beam of radiation energy such as light or UV rays through the mask to a radiation sensitive substrate or wafer, optical means for forming a focused image of the mask pattern on the radiation sensitive substrate and a pellicle cover for maintaining the images of any dirt particles on the surface of the mask out of focus. The pellicle cover is normally bonded to the substrate and completely covers the mask pattern. Such systems, for example, are described in U.S. Pat. Nos. 4,063,812 and 4,131,361 and in an article by Ron Hershel entitled: "Pellicle Protection of Integrated Circuits (IC) Masks", appearing in SPIE, vol. 275 Semiconductor Microlithography V1, (1981) page 23.

With increasing miniaturization, the pattern elements have become smaller and smaller to the extent that pattern resolution is limited by the wavelength of the light. This has led to the use of shorter wavelengths of the UV spectrum.

One disadvantage of the mask covers used heretofore is that they are only suitable for use in the range of from 4000 angstroms and above. Thus, an object of this invention is to provide a new and improved method of making a pellicle cover, which is suitable for use in the 2000 and 3000 angstrom range.

SUMMARY OF THE INVENTION

Briefly, in order to accomplish the desired results, the invention provides a new and improved method of fabricating a pellicle cover assembly for use in a projection printing system for forming an image on a radiation sensitive wafer, said method comprising the steps of tensioning and mounting a thin metal membrane on a metal ring, coating the front surface of said membrane with a uniform thin polymer film which in one form of the invention is polymethylmethacrylate, and curing said polymer film. The method further comprises the steps of coating the back surface of the membrane with photoresist, defining an aperture of preselected dimension in said photoresist by exposure and development, hard baking said photoresist, and etching said thin metal membrane away, leaving a free standing polymer film.

In one form of the invention there is provided a new and improved method of fabricating a pellicle cover assembly for use in a projection printing system, which includes the steps of applying a gold film onto the surface of an oxidized silicon wafer, coating a thin uniform polymer film, which in one form of the invention is polymethylmethacrylate, onto the gold film surface of said wafer, and curing the polymer film. The method further comprises the steps of adhering a pellicle support ring to the polymer film, making a circular cut between the ring and the wafer edges through the polymer and gold films, so that the wafer surface is exposed, carefully peeling the ring off the wafer resulting in a gold coated polymer membrane that is already mounted on a pellicle support ring, and thence etching off the gold.

There has thus been broadly outlined the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception upon which the disclosure is based may readily be utilized as a basis for designing other systems for carrying out the several purposes of the invention. It is important, therefore, that the claims be regarded as including such equivalent methods as do not depart from the spirit and scope of the invention.

Specific embodiments of the invention have been chosen for purposes of illustration and description, and are shown in the accompanying drawings, forming a part of this specification.

DETAILED DESCRIPTION OF THE INVENTION

Figure 1:
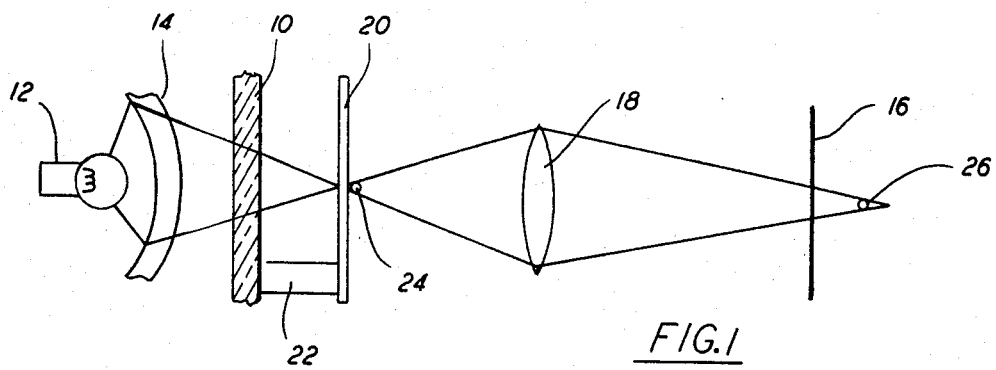
FIG. 1 is a schematic drawing of a projection printing system for forming an image on a radiation sensitive coated wafer constructed in accordance with the concepts of the present invention.

Referring to FIG. 1, there is shown a projection printing system for forming an image on a radiation sensitive wafer, which comprises a mask 10 having a transparent substrate with a pattern of opaque and transparent areas formed on one surface thereof. An illuminating system is provided which includes a radiation source 12 and a condenser lens system 14 for directing radiation through the mask 10 to a radiation sensitive coated wafer member 16. An optical system 18 serves to form a focused image of the mask pattern on the wafer. A pellicle cover 20 is mounted on the mask 10, as by means of a support ring 22. As a result, scratching or particulate contaminates 24, which would otherwise rest on the mask surface, now rest on the surface of the pellicle and hence are focused out of the focal plane by thousands of times the depth of field, as indicated at 26, FIG. 1. Their shadows are dissipated over the image field and have no effect on the resist image.

According to the present invention, the pellicle 20 is a thin polymer film. Polymethylmethacrylate (PMMA) has been found to be a particularly desirable material. Among other possible desirable parameters, PMMA has a high transmission in the range of from about 2600 angstroms to about 8000 angstroms, low light scattering, and thickness uniformity. It is also rugged enough to be handled and cleaned without damage.

Figure 2:
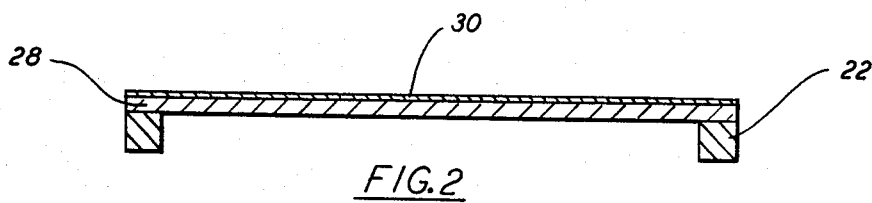
FIGS. 2 to 5 are side elevations showing the method steps involved for forming a pellicle cover assembly according to one embodiment of the invention.
Figure 3:
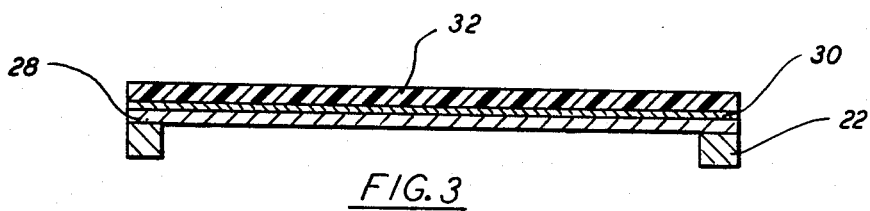
Figure 4:
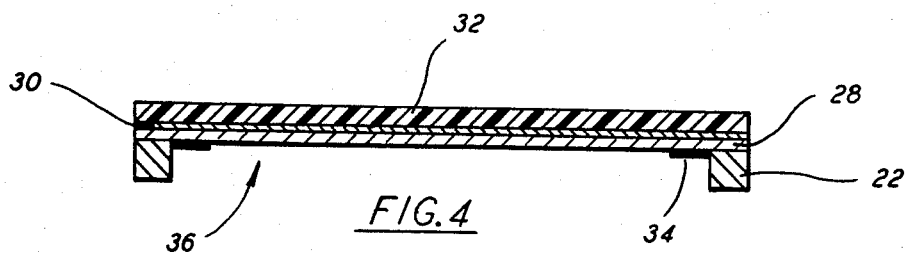
Figure 5:
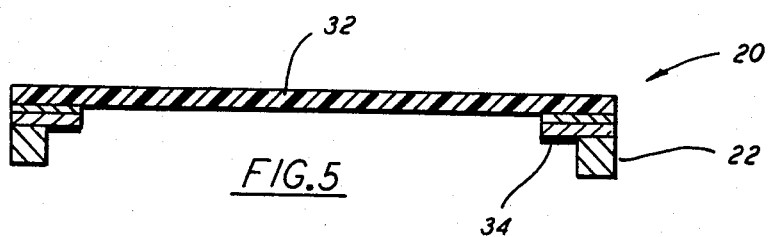

Further, according to the invention, there is provided a new and improved method of fabricating the pellicle assembly. This method comprises the steps of taking a thin membrane, having a one micrometer titanium layer 28, FIG. 2, and a 300 angstrom gold layer 30, and tensioning it and mounting it on the ring 22 to form a substrate. This membrane may be metallic or nonmetallic depending on the application. However, a particularly desirable membrane comprises a titanium layer and a gold layer. Referring to FIG. 3, a thin polymer film or polymethylmethacrylate, (PMMA), 32 is then coated on the surface of the gold layer 30 in a uniform film using any suitable conventional technique such as spinning, for example. Then the PMMA polymer film 32 is cured. The back surface of the substrate, i.e., the exposed surface of the titanium 28 is then coated with photoresist 34. An aperture of the desired dimension is then defined in this photoresist by exposure and development, as indicated at 36 in FIG. 4. After hard baking the photoresist 34, the titanium layer 28 is etched away using a solution of hydrogen fluoride and deionized water, 1 to 19, as shown in FIG. 5. Immediately after rinsing in the deionized water, the gold layer 30 is etched away by a suitable conventional gold etching technique, leaving a free standing PMMA polymer membrane or cover as seen in FIG. 5. The film thickness can be varied as desired from a few thousand angstroms to many microns.

Figure 6:
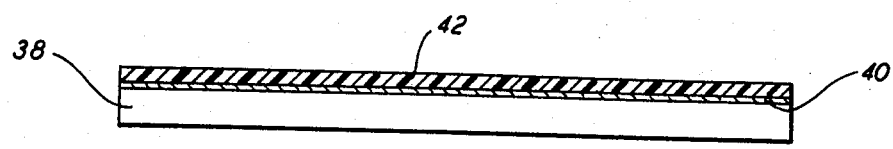
FIGS. 6 to 9 are side elevations showing the series of steps involved and the method of fabricating a pellicle cover assembly according to another embodiment of the invention.
Figure 7:
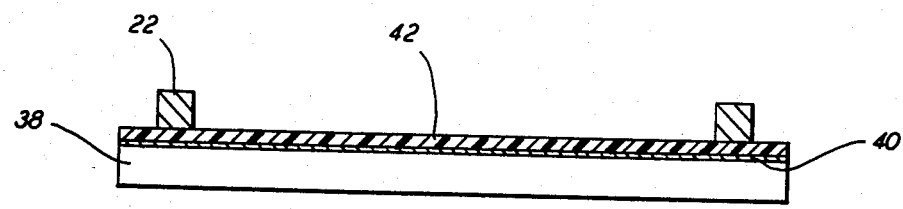
Figure 8:
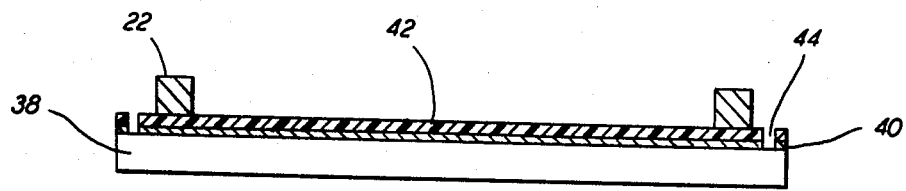

FIGS. 6 to 8 illustrate a second method of fabricating the pellicle assembly, according to the invention. This method has certain advantages over the previously described method, because it is simpler, less expensive and allows for the use of standard equipment and some of the same techniques which are already in use in the semiconductor industry. The starting substrate is an oxidized wafer 38, FIG. 6, the size thereof being dependent on the required finished pellicle size. Onto the polished surface of this wafer, a 500 angstrom gold layer 40 is vacuum evaporated. A thin uniform PMMA polymer film 42 is coated onto the surface of the gold film, using suitable conventional spinning techniques. Thence, the polymer is cured, preferably at about 170° C. As seen in FIG. 7, the next fabricating step comprises epoxying the pellicle support or mounting ring 22 onto the surface of the polymer layer 42. Then, with a razor blade or the like, a circular cut is made around the mounting ring 22, i.e., between the ring and the wafer edge, through the PMMA polymer layer 42 and gold film 40 so that the wafer surface is exposed, as indicated at 44, FIG. 8.

Figure 9:
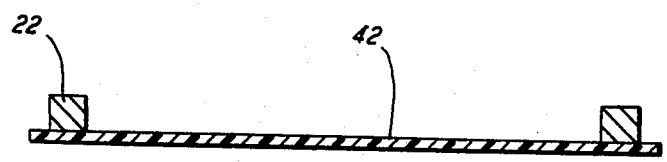

The next step in the method is to carefully peel the ring off the wafer, resulting in a gold coated polymer membrane that is already mounted on a suitable pellicle ring. Then the gold is etched off by a suitable, conventional gold etching technique, such as for example by using potassium iodille/iodine/water solution, to produce the desired pellicle assembly as seen in FIG. 9.

In some instances it may be desired to use a silicon wafer coated with chromium and then gold. In this case, after application and curing, the polymer membrane may be peeled directly off the gold surface, eliminating the gold etching step.

It will thus be seen that the present invention does indeed provide a new and improved pellicle assembly, which has a high transmission in the range of from about 2600 angstroms to about 8000 angstroms, low light scattering, and thickness uniformity, and which is rugged enough to be handled and cleaned without damage. Although specific embodiments have been illustrated and described, it will be obvious to those skilled in the art that various modifications may be made without departing from the spirit and scope of the invention which is to be limited solely by the appended claims.

What is claimed is:

1. A method of fabricating a pellicle cover assembly for use in a projection system for forming an image on a radiation sensitive wafer, said method comprising the steps of:

applying a gold film onto the surface of a wafer;

applying a thin uniform polymer film onto the gold film surface of said wafer;

curing said polymer film;

adhering a pellicle support ring to the polymer film;

cutting through the polymer and gold films between the ring and wafer edges to expose the wafer surface;

carefully peeling the ring off the wafer, resulting in a gold coated polymer membrane that is already mounted on a pellicle support ring; and etching off the gold film.

2. A method of fabricating a pellicle cover assembly according to claim 1 wherein said wafer is an oxidized silicon wafer.

3. A method of fabricating a pellicle cover assembly according to claim 1 wherein the gold film has a thickness of about 500 angstroms.

4. A method of fabricating a pellicle cover assembly according to claim 1 wherein said step of coating a thin polymer film onto the surface of the wafer uses a spinning process.

5. A method of fabricating a pellicle cover assembly according to claim 1 wherein said step of curing the polymer film is effected in an oven at a temperature of about 170° C.

6. A method of fabricating a pellicle cover assembly according to claim 1 wherein said step of etching off the gold is effected with a solution of potassium iodide.

7. A method of fabricating a pellicle cover assembly according to claim 1 wherein said step of applying a gold film is effected by vacuum evaporation.

8. A method of fabricating a pellicle cover assembly according to claim 1 wherein said polymer film is polymethymethacrylate.

9. A method of fabricating a pellicle cover assembly for use in a projection system for forming an image on a radiation sensitive wafer, said method comprising the steps of:

applying a gold film of about 500 angstroms thickness onto the surface of an oxidized silicon wafer by vacuum evaporation;

coating a thin uniform polymer film of polymethylmethacrylate onto the gold film surface of said wafer using a spinning process;

curing said polymer film in an oven at a temperature of about 170° C.;

epoxying a pellicle support ring to the polymer film;

cutting around the ring between the ring and the wafer edges through the polymer and gold films so that the wafer surface is exposed;

peeling the ring off the wafer resulting in a gold coated polymer membrane that is already mounted on a pellicle support ring; and etching off the gold film with a solution of hydrogen iodide.

10. A method of fabricating a pellicle cover assembly for use in a projection printing system for forming an image on a radiation sensitive wafer, said method comprising the steps of:

applying a thin gold film onto a chromium coated surface of a silicon wafer, applying a thin uniform polymer film onto the gold film surface of said wafer, curing said polymer film, adhering a pellicle support ring to the polymer film; and carefully peeling the polymer film directly off the gold surface.

11. A method of fabricating a pellicle cover assembly according to claim 10 wherein said polymer film is polymethylmethacrylate.

12. A method of fabricating a pellicle cover assembly according to claim 10 wherein said gold film has a thickness of about 500 angstroms.

13. A method of fabricating a pellicle cover assembly according to claim 10 wherein said step of applying a polymer film uses a spinning process.

14. A method of fabricating a pellicle cover assembly according to claim 10 wherein said step of curing the polymer film is effected in an oven at a temperature of about 170° C.

15. A method of fabricating a pellicle cover assembly according to claim 10 wherein said step of applying a gold film is effected by vacuum evaporation.

* * * * *